(12) United States Patent
Kwak (10) Patent No.: US 7,099,232 B2
(45) Date of Patent: Aug. 29, 2006

(54) DELAY LOCKED LOOP DEVICE

(75) Inventor: Jong-Tae Kwak, Ichon-shi (KR)

(73) Assignee: Hynix Semiconductor Inc., (KR)

( * ) Notice: Subject to any disclaimer, the term of this patent is extended or adjusted under 35 U.S.C. 154(b) by 167 days.

(21) Appl. No.: 10/877,876

(22) Filed: Jun. 25, 2004

(65) Prior Publication Data

US 2005/0249027 A1    Nov. 10, 2005

(30) Foreign Application Priority Data

May 6, 2004    (KR) .................. 10-2004-0031983

(51) Int. Cl.
*G11C 8/00* (2006.01)
(52) U.S. Cl. .................. 365/233; 365/194; 327/158
(58) Field of Classification Search ................ 365/233, 365/194; 327/158, 160
See application file for complete search history.

(56) References Cited

U.S. PATENT DOCUMENTS

| 5,956,290 | A | 9/1999 | Matsuzaki |
| 6,119,242 | A | 9/2000 | Harrison |
| 6,201,424 | B1 | 3/2001 | Harrison |
| 6,222,894 | B1 | 4/2001 | Lee |
| 6,259,290 | B1 * | 7/2001 | Takada et al. ............... 327/158 |
| 6,281,725 | B1 | 8/2001 | Hanzawa et al. |
| 6,327,196 | B1 | 12/2001 | Mullarky |
| 6,333,959 | B1 | 12/2001 | Lai et al. |
| 6,346,839 | B1 | 2/2002 | Mnich |
| 6,437,616 | B1 * | 8/2002 | Antone et al. ............... 327/158 |
| 6,499,111 | B1 | 12/2002 | Mullarky |
| 6,518,807 | B1 * | 2/2003 | Cho ........................... 327/158 |
| 6,556,488 | B1 * | 4/2003 | Han ........................... 365/194 |
| 6,570,815 | B1 * | 5/2003 | Kashiwazaki ............... 365/233 |

FOREIGN PATENT DOCUMENTS

| JP | 01-305634 | 12/1989 |
| JP | 11-126479 | 5/1999 |
| JP | 2001-023383 | 1/2001 |

* cited by examiner

*Primary Examiner*—Huan Hoang
(74) *Attorney, Agent, or Firm*—Blakely Sokoloff Taylor & Zafman (57) ABSTRACT

An apparatus for detecting locking information of a DLL clock in a semiconductor memory device includes a delayed locked loop for generating a first comparison signal and a first delay end signal; a phase state storing block for receiving the first comparison signal and the first delay end signal to thereby generate a locking selection signal; and a locking information detector for generating a locking state signal presenting the locking information in response to the first comparison signal, the first delay end signal and the locking selection signal.

19 Claims, 5 Drawing Sheets

DELAY LOCKED LOOP DEVICE

FIELD OF THE INVENTION

The present invention relates to a delay locked loop (DLL) device; and, more particularly, to a DLL device which synchronizes an internal clock signal with an external clock signal.

DESCRIPTION OF THE PRIOR ART

Generally, a clock signal of a system or a circuit is used as a reference for synchronizing an execution timing and guaranteeing an error-free high speed operation. When an external clock signal of an external circuit is used in an internal circuit, a clock signal skew is generated from an internal circuit because of timing gap between the external clock signal and the internal clock signal. A delay locked loop (hereinafter, referred as a DLL) compensates the clock signal skew for equalizing a phase of the internal clock signal to that of the external clock signal.

In addition, the DDL are broadly used in a synchronous semiconductor memory device including a double data rate synchronous dynamic random access memory (DDR SDRAM) because it has an advantage with being less affected by a noise, as compared to a phase locked loop (hereinafter, referred as PLL). Among various types of the DLL, a register controlled DLL is the most generally used.

The DLL in the synchronous semiconductor memory device synchronizes a data output with the external clock signal by fore-reflecting a negative delay after receiving the external clock signal and compensating a delay value of data and clock signal paths.

Recently, the DLL is continuously developed for eliminating a jitter by reducing a minimum variable delay time tUD. Particularly, to reduce the minimum variable delay time tUD, the DLL having a course delay line and a fine delay line is provided.

Figure 1:
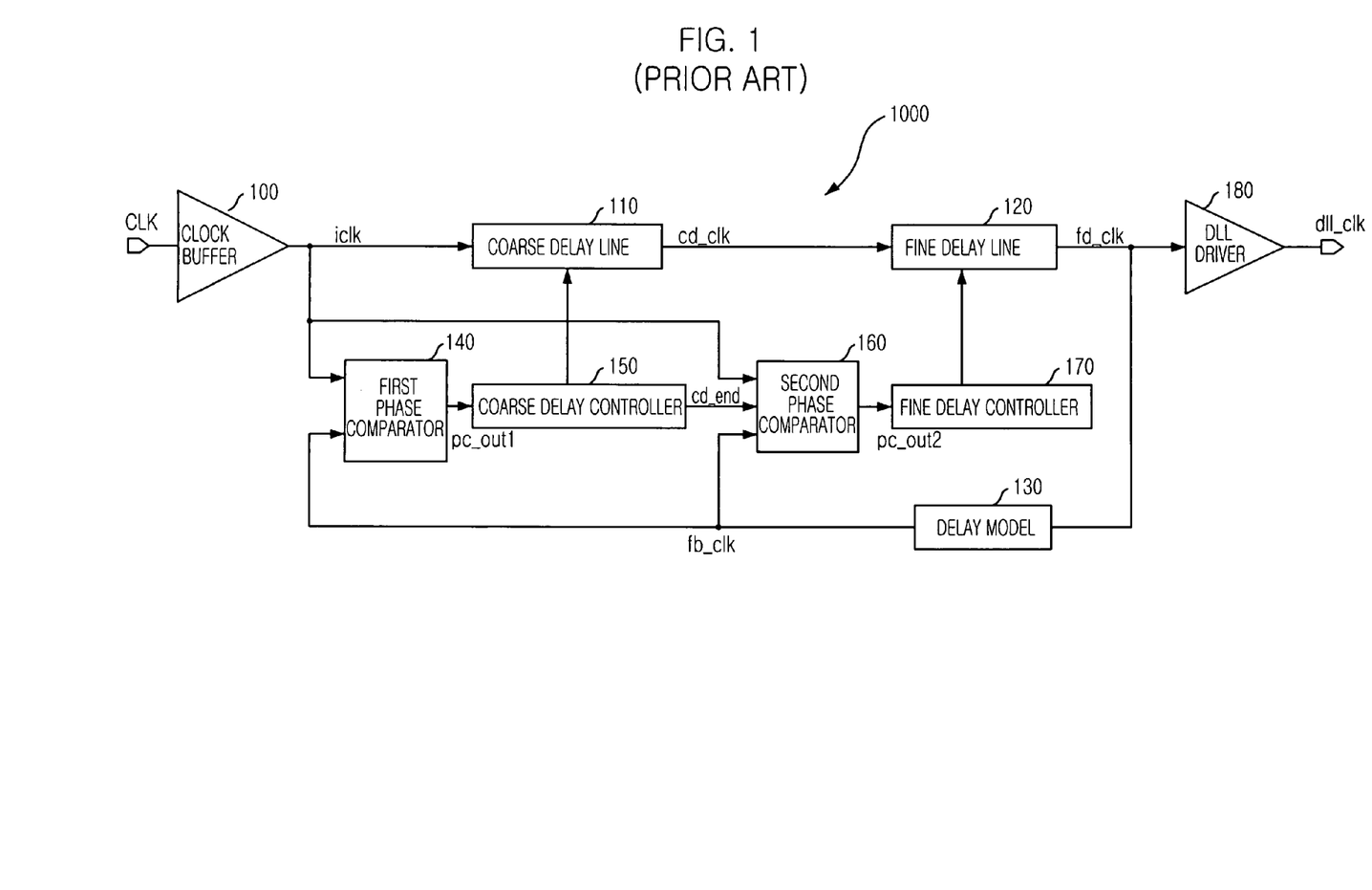
FIG. 1 is a block diagram showing a conventional DLL having hierarchy delay line blocks in a conventional semiconductor memory device.

FIG. 1 is a block diagram showing a conventional DLL having hierarchy delay line blocks in a conventional semiconductor memory device.

As shown, the conventional DLL includes a clock buffer 100, first and second phase comparators 140 and 160, a coarse delay line block 110, a coarse delay controller 150, a fine delay line block 120, a fine delay controller 170, a delay model block 170 and a DLL driver 180.

The clock buffer 100 receives an external clock signal CLK to output the inputted external clock signal as an internal clock signal iclk to the coarse delay line block 110. The coarse delay line block 110 receives and delays the internal clock signal iclk to thereby a coarse delayed internal clock signal cd_clk. The coarse delayed internal clock signal cd_clk is inputted to the fine delay line block 120. The fine delay line block 120 delays the coarse delayed clock signal cd_clk in order to output a fine delayed clock signal fd_clk to the DLL driver 180 and the delay model block 170. The DLL driver 180 is for buffering the fine delayed clock signal fd_clk to thereby generate a DLL clock signal dll_clk.

In addition, the delay model block 170, which is a kind of replica circuit, estimates a delay amount generated while the internal clock signal INTCLK2 travels to a data input-output pin (DQ pin), i.e., an actual clock or data path. Then, the delay model block 170 delays the fine delayed clock signal fd_clk by the delay amount to thereby generate a feedback signal fb_clk.

The feedback signal fb_clk is inputted to the first and second phase comparators 140 and 160. The first phase comparator 140 receives the internal clock signal iclk and the feedback signal fb_clk to thereby generate a first comparison signal pc_out1 based on a first result of comparing a phase of the internal clock signal iclk with that of the feedback signal fb_clk. Then, in response to the first comparison signal pc_out1, the coarse delay controller 150 controls a coarse delay amount of the coarse delay line block 110. If a phase difference between the internal clock signal iclk and the feedback signal fb_clk is under a predetermined coarse delay amount controlled by the coarse delay line block 110, i.e., the coarse delay line block 110 does not need to delay the internal clock signal iclk any longer, a coarse delay end signal cd_end outputted from the coarse delay controller 150 is activated.

Likewise, the second phase comparator 160 receives the internal clock signal iclk, the coarse delay end signal cd_end and the feedback signal fb_clk to thereby generate a second comparison signal pc_out2 based on a second result of comparing a phase of the internal clock signal iclk with that of the feedback signal fb_clk. Then, in response to the second comparison signal pc_out2, the fine delay controller 150 controls a fine delay amount of the fine delay line block 110.

Namely, for locking the DLL clock signal dll_clk with the external clock signal CLK, the coarse delay line block 110 generates the coarse delayed clock signal cd_clk after rapidly delaying the internal clock signal iclk by approximately and roughly delay amount. Then, the fine delay line block 120 receives the coarse delayed clock signal cd_clk, which is roughly similar to the external clock CLK, and minutely delays the coarse delayed clock signal cd_clk based on the second result to thereby locking the DLL clock signal dll_clk.

However, although the conventional DLL can output the DLL clock signal dll_clk completely locked with the external clock signal CLK, the conventional DLL does not have any functional block for outputting a locking information of the conventional DLL to other blocks included in the conventional semiconductor memory device. Herein, the locking information means whether or not the feedback signal fb_clk is locked with the external clock signal CLK.

At a timing of locking the feedback signal fb_clk with the external clock signal CLK, i.e., a locking timing, the conventional semiconductor memory device can performs a plurality of internal operations related to a data read or write operations. However, referring to FIG. 1, the conventional DLL cannot output the locking information to other blocks in the conventional semiconductor memory device. Thus, because the conventional semiconductor memory device cannot directly catch the locking timing, the conventional semiconductor memory device should be waited pretty long time after the feedback signal fb_clk is actually locked with the external clock signal CLK.

SUMMARY OF INVENTION

It is, therefore, an object of the present invention to provide a semiconductor memory device having a delayed lock loop (DLL), which has hierarchy delay line blocks, for detecting locking information and outputting the locking information to other blocks in the semiconductor memory device in order to improve an operation speed of the semiconductor memory device.

In accordance with an aspect of the present invention, there is provided an apparatus for detecting locking information of a DLL clock in a semiconductor memory device includes a delayed locked loop for generating a first comparison signal and a first delay end signal; a phase state storing block for receiving the first comparison signal and the first delay end signal to thereby generate a locking selection signal; and a locking information detector for generating a locking state signal presenting the locking information in response to the first comparison signal, the first delay end signal and the locking selection signal.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a delay locked loop (DLL) device in accordance with the present invention will be described in detail referring to the accompanying drawings.

Figure 2:
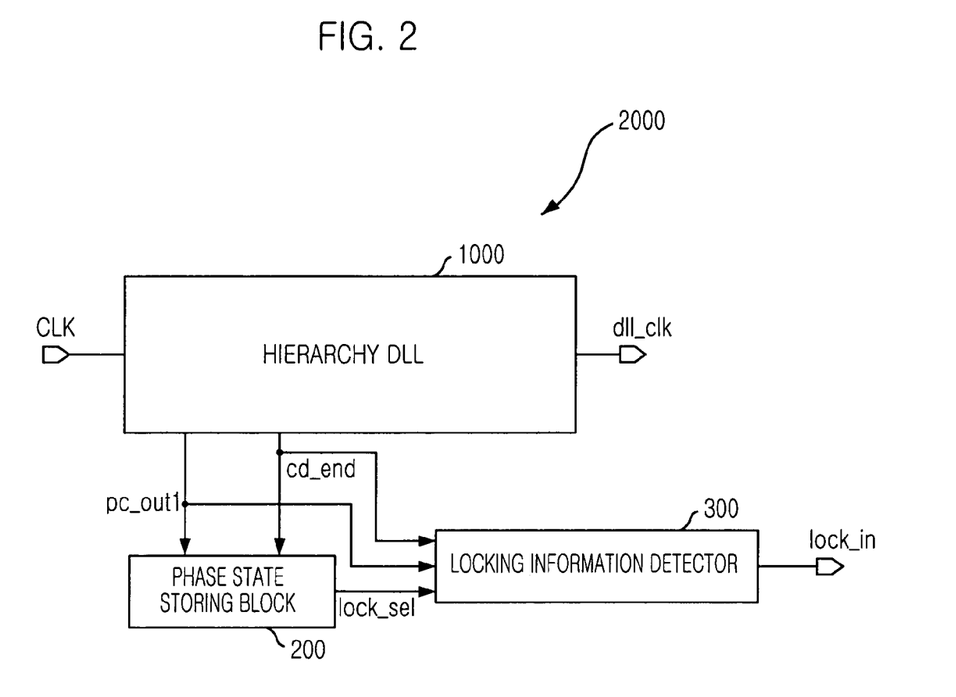
FIG. 2 is a block diagram showing a DLL device in accordance with the present invention.

FIG. 2 is a block diagram showing a DLL device 2000 in accordance with the present invention.

As shown, the DLL device 2000 includes a hierarchy DLL 1000, a phase state storing block 200 and a locking information detector 300.

Herein, the hierarchy DLL is the similar to the conventional DLL described in FIG. 1. However, for detecting locking information in order to improve an operation speed of the semiconductor memory device, the hierarchy DLL outputs a first comparison signal pc_out1, which is outputted from the first phase comparator 140 shown in FIG. 1, and a coarse delay end signal cd_end, which is outputted from the coarse delay controller 150 shown in FIG. 1, to the phase state storing block 200 and the locking information detector 300.

The phase state storing block 200 receives the first comparison signal pc_out1 and the coarse delay end signal cd_end outputted from the hierarchy DLL to thereby generate a locking selection signal lock_sel.

The locking information detector 300 generates a locking state signal lock_in presenting the locking information in response to the first comparison signal pc_out1, the coarse delay end signal cd_end and the locking selection signal lock_sel.

Figure 3:
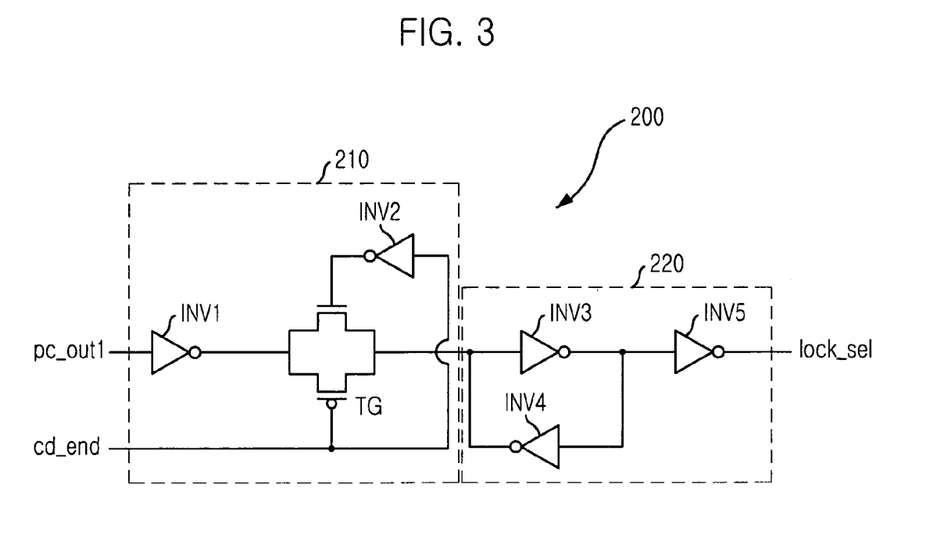
FIG. 3 is a circuit diagram describing a phase state storage block shown in FIG. 2.

FIG. 3 is a circuit diagram describing the phase state storage block 200 shown in FIG. 2.

As shown, the phase state storage block 200 includes a switching block 210 and a latching block 200. The switching block 210 is for transmitting the first comparison signal pc_out1 in response to the course delay end signal cd_end. The latching block 220 latches the transmitted first comparison signal to thereby generate the locking selection signal lock_sel.

In detail, the switching block 210 includes a first inverter INV1, a second inverter INV2 and a transfer gate TG. The first inverter INV1 receives the first comparison signal pc_out1 and inverts the first comparison signal pc_out1. Also, the second inverter INV2 is for inverting the course delay end signal cd_end. The transfer gate TG transmits the inverse first comparison signal, which is outputted from the first inverter, in response to the first delay end signal cd_end and the inverse first delay end signal which is outputted from the second inverter.

The latching block 220 is constituted with third to fifth inverters INV3 to INV5. The third inverter INV3 receives the transmitted first comparison signal; and the fourth inverter INV4 is circularly connected to the third inverter INV3 for latching the transmitted first comparison signal. Also, the latching block 220 further includes fifth inverter INV5 for inverting the transmitted first comparison signal to thereby generate as the locking selection signal lock_sel.

Figure 4:
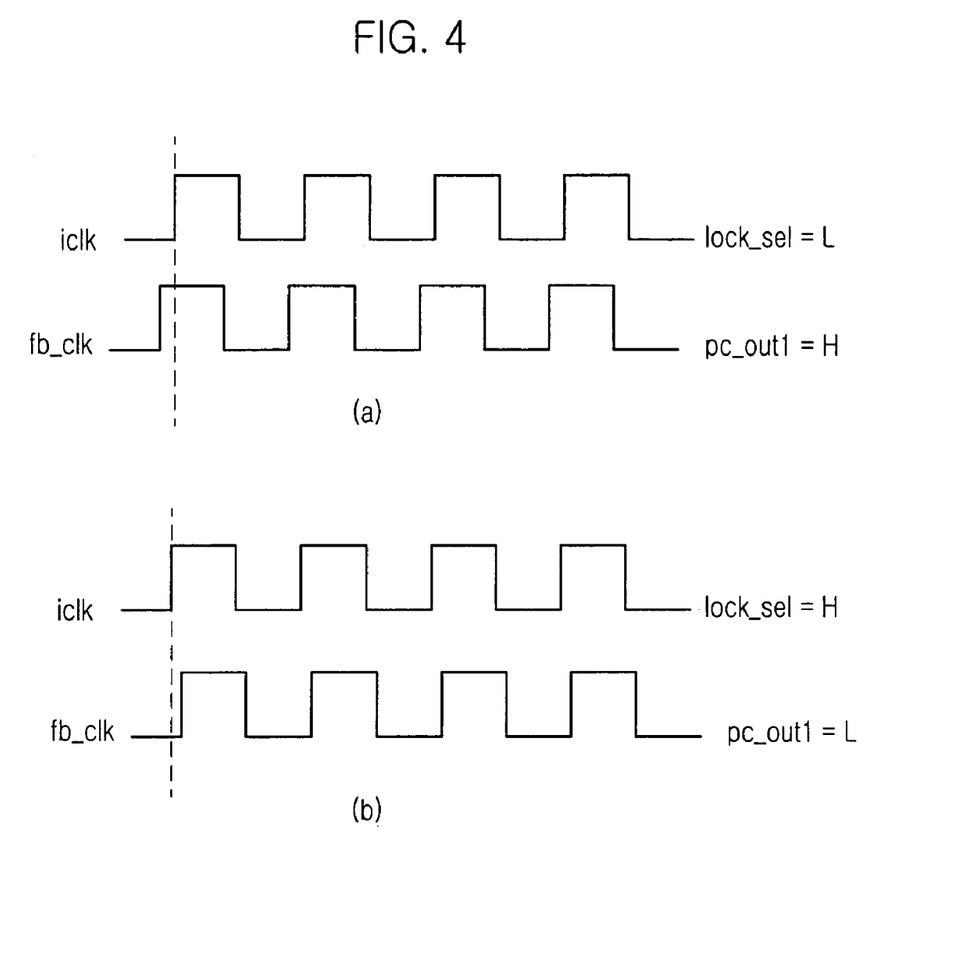
FIG. 4 is a waveform demonstrating an operation of the phase state storage block shown in FIG. 2.

FIG. 4 is a waveform demonstrating an operation of the phase state storage block shown in FIG. 2.

Particularly, logic states of the coarse delay end signal cd_end and the first comparison signal are described when the coarse delay line 110 in the hierarchy DLL does not delay the internal clock signal iclk anymore because a phase of the internal clock signal iclk is much closed to that of a feedback signal fb_clk. Namely, at this time, the fine delay line block 120 is enabled and minutely delays a coarse delayed internal clock signal cd_clk by a fine delay amount for generating a DLL clock signal dll_clk.

Referring to FIG. 4, at a timing of activating the coarse delay end signal cd_end as a logic high state, the first comparison signal pc_out1 is a logic high state if a rising edge of the feedback signal fb_clk leads a rising edge of the internal clock signal iclk shown in case (a). Then, the locking selection signal lock_sel becomes a logic low state.

Otherwise, at the timing of activating the coarse delay end signal cd_end as a logic high state, the first comparison signal pc_out1 is a logic low state if a rising edge of the feedback signal fb_clk lags a rising edge of the internal clock signal iclk shown in case (b). Then, the locking selection signal lock_sel becomes a logic high state.

Figure 5:
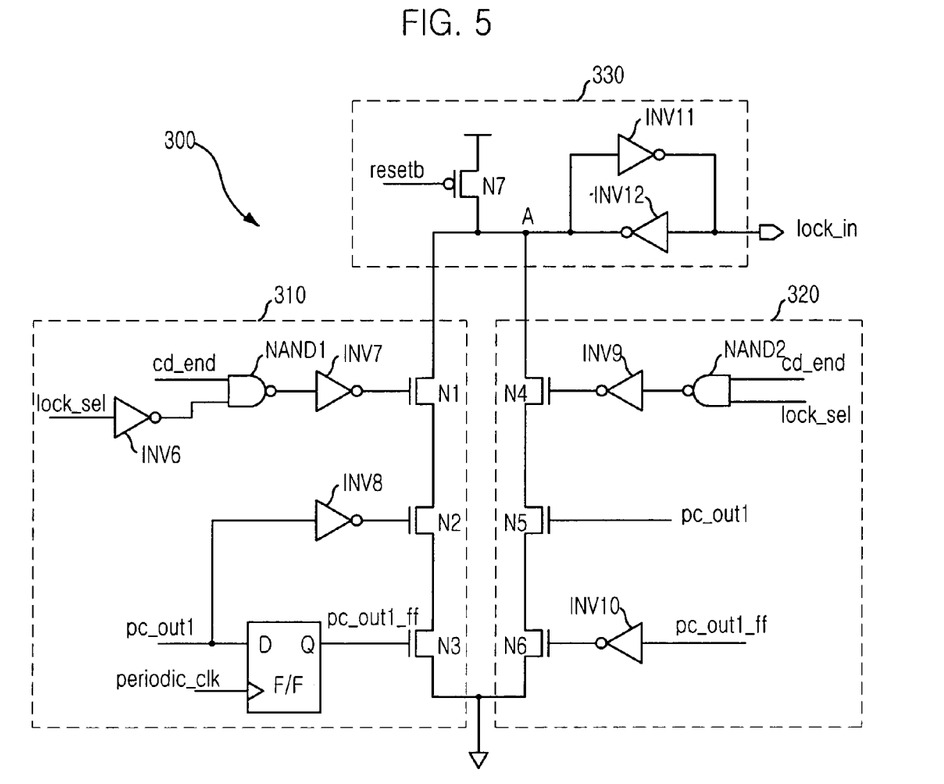
FIG. 5 is a circuit diagram depicting a locking information detector shown in FIG. 2.

FIG. 5 is a circuit diagram depicting the locking information detector 300 shown in FIG. 2.

As shown, the locking information detector 300 includes a first phase detector 310, a second phase detector 320 and an output block 330.

The first phase detector 310 is for detecting a first timing of changing a logic high state of the first comparison signal pc_out1 into a logic low state of the first comparison signal pc_out1. That is, the first timing means the timing when the phase of feedback signal fb_clk lags the phase of the internal clock signal iclk at the first time in the duration of adjusting a delay amount by the fine delay line block 120 shown in FIG. 1. Also, the second phase detector 320 is for detecting a second timing of changing the logic low state of the first comparison signal pc_out1 into the logic high state of the first comparison signal pc_out1. Namely, the second timing means the timing when the phase of feedback signal fb_clk leads the phase of the internal clock signal iclk at the first time in the duration of adjusting a delay amount by the fine delay line block 120 shown in FIG. 1. The output block 330 generates the locking state signal lock_in in response to outputs of the first and second phase detectors 310 and 320.

Herein, the output block 330 includes an initialization block for resetting a node A coupled to the first and second phase detectors 310 and 320; and a latching block for latching a logic state of first and second detection signals, which is respectively outputted from the first and second phase detectors 310 and 320, to thereby generate as the locking state signal lock_in. The initialization block is constituted with a seventh MOS transistor N7 having a gate, a drain and a source, wherein the gate is coupled to an inverse reset signal resetb and each drain/source are coupled to each of a supply voltage and the latching block. Also, the latching block includes two inverters, i.e., INV11 and INV12, circularly connected to each other.

Furthermore, the first phase detector 310 includes a first enable block for supplying a ground in response to the first comparison signal pc_out1; a second enable block for supplying an outputted voltage of the first enable signal in response to the first comparison signal pc_out1; and a third enable block for supplying an outputted voltage of the second enable block to the output block in response to the coarse delay end signal cd_end and the locking selection signal lock_sel.

In detail, the first phase detector 310 includes first to third MOS transistors N1 to N3, sixth and eighth inverters INV6 and INV8, a first NAND gate NAND1 and a flip-flop F/F.

The sixth inverter INV6 receives the locking selection signal lock_sel. An output signal of the sixth inverter INV6 is inputted to the first NAND gate NAND1. The first NAND gate NAND1 receives the coarse delay end signal cd_end and the output signal of the sixth inverter INV6 to thereby generate a resultant signal of logic NAND operation. The seventh inverter INV7 is for inverting the resultant signal outputted from the NAND gate. The first MOS transistor N1 has a gate, a drain and a source, wherein the gate receives the inverse resultant signal, which is outputted from the seventh inverter INV7, and each drain/source are coupled to the second MOS transistor N2 and the node A of the output block.

Also, the eighth inverter INV8 is for inverting the first comparison signal pc_out1. The second MOS transistor has a gate, a drain and a source, wherein the gate receives an output signal of the eighth inverter INV8 and a drain/source is coupled to the third MOS transistor N3.

The flip-flop F/F is for receiving the first comparison signal pc_out1 at an input terminal and a clock signal periodic_clk at a clock input terminal to thereby generate a first synch comparison signal pc_out1_ff synchronized with the clock signal periodic_clk. The first synch comparison signal pc_out1_ff is inputted to the third MOS transistor N3. The third MOS transistor N3 has a gate, a drain and a source, wherein the gate receives the first synch comparison signal pc_out1_ff and each drain/source are coupled to each of the ground and a drain/source of the second NMOS transistor N2.

In addition, the second phase detector 320 is similar to the first phase detector 310 in their structures.

The second phase detector 320 includes a fourth enable block for supplying the ground in response to the first comparison signal; a fifth enable block for supplying an outputted voltage of the first enable signal in response to the first comparison signal; and a sixth enable block for supplying an outputted voltage of the second enable block to the output block in response to the coarse delay end signal cd_end and the locking selection signal lock_sel.

In detail, the second phase detector 320 includes fourth to sixth MOS transistors N4 to N6, ninth and tenth inverters INV9 and INV10 and a second NAND gate NAND2.

The second NAND gate NAND2 is for receiving the coarse delay end signal cd_end and the locking selection signal lock_sel to thereby generate a resultant signal of logic NAND operation. The ninth inverter INV9 is for inverting the resultant signal outputted from the second NAND gate NAND2. The fourth MOS transistor N4 has a gate, a drain and a source, wherein the gate receives a resultant signal, which is outputted from the ninth inverter INV9, and each drain/source are coupled to the fifth MOS transistor and the node A of the output block.

The fifth MOS transistor N5 has a gate, a drain and a source, wherein the gate receives the first comparison signal pc_out1 and each drain/source are coupled to each of the fourth and sixth MOS transistors.

The tenth inverter INV10 is for inverting the first synch comparison signal pc_out1_ff which is outputted from the flip-flop F/F. The sixth MOS transistor N6 has a gate, a drain and a source, wherein the gate receives the inverse first synch comparison signal and each drain/source are coupled to each of the ground and the fifth MOS transistor N5.

Hereinafter, referring to FIGS. 2 to 5, operation of the DLL device 2000 is described in detail.

First of all, in the hierarchy DLL, the internal clock signal iclk is delayed by the coarse delay line block 110 until the coarse delay end signal cd_end is activated. Herein the coarse delay end signal cd_end is initially a logic low state; and is activated as a logic high state if a phase difference between the feedback signal fb_clk and the internal clock iclk is under a predetermined amount, i.e., cannot be controlled by the coarse delay line block 110.

Thereafter, if the coarse delay end signal cd_end is activated, the fine delay line block 120 controls a delay amount for synchronizing the phase of the feedback signal fb_clk with the phase of the internal clock signal iclk. At this time, there are two case described in FIG. 4.

Before the coarse delay end signal cd_end is activated as a logic high state, the transfer gate TG of the phase state storing block 200 shown in FIG. 3 is always opened; and, then, the first comparison signal pc_out1 is inverted and outputted as the locking selection signal lock_sel. Thereafter, if the coarse delay end signal cd_end is activated as a logic high state, the transfer gate TG is closed and the first comparison signal pc_out1 is not delivered. Thus, latched logic state in the latching block 220 is outputted as the locking selection signal lock_sel.

Namely, as above described, at a timing of terminating an operation of the coarse delay end signal cd_end, the first comparison signal pc_out1 is a logic high state if a rising edge of the feedback signal fb_clk leads a rising edge of the internal clock signal iclk shown in case (a). Then, the locking selection signal lock_sel becomes a logic low state.

Otherwise, at a timing of terminating an operation of the coarse delay end signal cd_end, the first comparison signal pc_out1 is a logic low state if a rising edge of the feedback signal fb_clk lags a rising edge of the internal clock signal iclk shown in case (b). Then, the locking selection signal lock_sel becomes a logic high state.

That is, the locking selection signal lock_sel reflects a phase difference between the feedback signal fb_clk and the internal clock signal iclk at the timing of terminating the operation of the coarse delay end signal cd_end.

Continuously, in the fine delay line block 120, the coarse delayed clock signal cd_clk is delayed. In the case (a) of FIG. 4, i.e., if the rising edge of the feedback signal fb_clk leads the rising edge of the internal clock iclk, the feedback signal fb_clk is delayed little by little. After repeatedly performing the operation of the fine delay line block 120, the rising edge of the feedback signal fb_clk will lag the rising edge of the internal clock iclk. At this timing, the first comparison signal pc_out1 becomes a logic low state from a logic high state.

On the other hand, in the case (b) of FIG. 4, i.e., if the rising edge of the feedback signal fb_clk lags the rising edge of the internal clock iclk, the feedback signal fb_clk is advanced little by little. After repeatedly performing the operation of the fine delay line block 120, the rising edge of the feedback signal fb_clk will lead the rising edge of the internal clock iclk. At this timing, the first comparison signal pc_out1 becomes a logic high state from a low high state.

In the present invention, at two above described timings, i.e., when a logic state of the first comparison signal pc_out1 is changed, it is approved that the DLL clock signal dll_clk is locked.

Hereinafter, an operation of the locking information detector 300 is described in detail.

First, at an initial state, if the inverse reset signal resetb is activated as a logic low state, the seventh MOS transistor is turned on; and the node A becomes a logic high state. Also, in each of the first and second phase detectors 310 and 320, at least one MOS transistor is turned off because the coarse delay end signal cd_end is a logic low state. Thus, the node A being a logic high state can be kept, i.e., is not discharged.

In duration of performing an operation of the coarse delay line block 110, a logic state of the node A is not changed. Namely, before the coarse delay end signal cd_end is activated as a logic high state, the logic state of the node A is not changed without regard to logic states of the locking selection signal lock_sel and the first comparison signal pc_out1.

Continuously, after finishing the operation of the coarse delay line block 110, the operation of the fine delay line block 120 is started.

Herein, in the case (a), i.e., when the first comparison signal pc_out1 is a logic high state and the locking selection signal lock_sel is a logic low state, the first MOS transistor N1 is turned on. Also, at every rising edge of the clock signal periodic_clk, e.g., a pulse activated as a logic high state at every 8 tCK, the flip-flop F/F outputs the first synch comparison signal pc_out1_ff being a logic high state to the third MOS transistor N3. As a result, the third MOS transistor N3 is turned on. Herein, if the first comparison signal pc_out1 becomes a logic low state, the second MOS transistor N2 is turned on; and, then, the node A is discharged, i.e., becomes a logic low state. Finally, the locking state signal lock_in is activated as a logic high state. On the other hand, during above described operation, the second phase detector 320 is not interested because the fourth MOS transistor N4 of the second phase detector 320 is turned off.

Contrary to the case (a), in the case (b), when the first comparison signal pc_out1 is a logic low state and the locking selection signal lock_sel is a logic high state, the fourth MOS transistor N4 is turned on. Also, the first synch comparison signal pc_out1_ff outputted from the flip-flop F/F becomes a logic low state; and, as a result, the sixth MOS transistor N6 is also turned on. Herein, if the first comparison signal pc_out1 becomes a logic high state, the fifth MOS transistor N5 is turned on; and, then, the node A is discharged, i.e., becomes a logic low state. Finally, the locking state signal lock_in is activated as a logic high state. On the other hand, during above described operation, the second phase detector 320 is not interested because the fourth MOS transistor N4 of the second phase detector 320 is turned off.

That is, at the timing of terminating the operation of the coarse delay line block 110, the first and second phase detectors 310 and 320 detect a timing of changing a logic state of the first comparison signal pc_out1 with regard to a phase difference between the feedback signal fb_clk and the internal clock iclk.

As above described, the present invention uses the hierarchy DLL having two delay line blocks, i.e., the coarse delay line block and the fine delay line block. Furthermore, the present invention can be applied to a DLL having just one delay line block.

In addition, any circuit component used in the present invention can be exchanged into a different circuit component.

The present invention can easily detect locking information of a DLL clock signal and improve an operation speed of the semiconductor memory device by using the locking information. Also, using the locking information, unnecessary operation in the semiconductor memory device can be reduced; and, thus, power consumption can be decreased.

The present application contains subject matter related to Korean patent application No. 2004-31983, filed in the Korean Patent Office on May 6, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. An apparatus for detecting locking information of a DLL clock in a semiconductor memory device, comprising:
    a delayed locked loop for generating a first comparison signal and a first delay end signal;
    a phase state storing means for receiving the first comparison signal and the first delay end signal to thereby generate a locking selection signal; and
    a locking information detector for generating a locking state signal presenting the locking information in response to the first comparison signal, the first delay end signal and the locking selection signal.

2. The apparatus as recited in claim 1, wherein the delayed locked loop, which receives an external clock and generates the DLL clock, includes two delay lines, each for delaying the external clock by a predetermined delay amount.

3. The apparatus as recited in claim 1, wherein the delayed locked loop includes:
    a clock buffer for receiving the external clock signal and generating an internal clock signal;
    a first delay line for delaying the internal clock signal by a first delay amount to thereby generate a first delayed clock signal;
    a second delay line for delaying the first delayed clock signal by a second delay amount to thereby generate a second delayed clock signal;
    a delay model for delaying the second delayed clock signal by a third predetermined delay amount to thereby generate a feedback signal, wherein the third predetermined delay amount;
    a first phase comparator for comparing a phase of the feedback signal with a phase of the internal clock signal and generating the first comparison signal based on a comparison result;
    a first delay controller for determining the first delay amount in response to the first comparison signal and generating the first delay end signal based on the first delay amount;
    a second phase comparator, which is enabled by the first delay end signal, for comparing the phase of the feedback signal with the phase of the internal clock signal and generating a second comparison signal based on a comparison result;

a first delay controller for determining the first delay amount in response to the first comparison signal and generating the first delay end signal based on the first delay amount; and a DLL driver for generating the second delayed clock signal as the DLL clock.

4. The apparatus as recited in claim 1, wherein the phase state storing means includes:

a switching block for transmitting the first comparison signal in response to the first delay end signal; and a latching block for latching the transmitted first comparison signal to thereby generate the locking selection signal.

5. The apparatus as recited in claim 4, wherein each of the switching block and latching block further includes an inverter.

6. The apparatus as recited in claim 4, wherein the switching block includes:

a first inverter for inverting the first comparison signal;

a second inverter for inverting the first delay end signal; and a transfer gate for transmitting the inverse first comparison signal, which is outputted from the first inverter, in response to the first delay end signal and the inverse first delay end signal which is outputted from the second inverter.

7. The apparatus as recited in claim 4, wherein the latching block includes:

a first inverter for receiving the transmitted first comparison signal;

a second inverter circularly connected to the first inverter for latching the transmitted first comparison signal; and a third inverter for inverting the transmitted first comparison signal to thereby generate as the locking selection signal.

8. The apparatus as recited in claim 1, wherein the locking information detector includes:

a first detector for detecting a first timing of changing a logic high state of the first comparison signal into a logic low state of the first comparison signal and generating a first detection signal;

a second detector for detecting a second timing of changing the logic low state of the first comparison signal into the logic high state of the first comparison signal and generating a second detection signal; and an output block for receiving the first and second detection signals and generating the locking state signal.

9. The apparatus as recited in claim 8, wherein the output block includes:

an initialization block for resetting the locking state signal; and a latching block for latching a logic state of the first and second detection signals to thereby generate as the locking state signal.

10. The apparatus as recited in claim 9, wherein the initialization block includes a MOS transistor having a gate, a drain and a source, wherein the gate is coupled to an inverse reset signal and each drain/source are coupled to each of a supply voltage and the latching block.

11. The apparatus as recited in claim 9, wherein the latching block is constituted with two inverters circularly connected to each other.

12. The apparatus as recited in claim 8, wherein the first detector includes:

a first enable block for supplying a ground in response to the first comparison signal;

a second enable block for supplying an outputted voltage of the first enable signal in response to the first comparison signal; and a third enable block for supplying an outputted voltage of the second enable block to the output block in response to the first delay end signal and the locking selection signal.

13. The apparatus as recited in claim 12, wherein the first enable block includes:

a first flip-flop for receiving the first comparison signal at an input terminal and a clock signal at a clock input terminal to thereby generate a first synch comparison signal synchronized with the clock signal; and a first MOS transistor having a gate, a drain and a source, wherein the gate receives the first synch comparison signal and each drain/source are coupled to each of the ground and the second enable block.

14. The apparatus as recited in claim 13, wherein the second enable block includes:

a first inverter for inverting the first comparison signal; and a second MOS transistor having a gate, a drain and a source, wherein the gate receives the inverse first comparison signal and each drain/source are coupled to each of the first and third enable blocks.

15. The apparatus as recited in claim 14, wherein the third enable block includes:

a second inverter for inverting the locking selection signal;

a first NAND gate for receiving the first delay end signal and the inverse locking selection signal outputted from the first inverter to thereby generate a resultant signal of logic NAND operation;

a third inverter for inverting the resultant signal outputted from the NAND gate; and a third MOS transistor having a gate, a drain and a source, wherein the gate receives the inverse resultant signal, which is outputted from the second inverter, and each drain/source are coupled to each of the second enable block and the output block.

16. The apparatus as recited in claim 15, wherein the second detector includes:

a fourth enable block for supplying the ground in response to the first comparison signal;

a fifth enable block for supplying an outputted voltage of the first enable signal in response to the first comparison signal; and a sixth enable block for supplying an outputted voltage of the second enable block to the output block in response to the first delay end signal and the locking selection signal.

17. The apparatus as recited in claim 16, wherein the first enable block includes:

a fourth inverter for inverting the first synch comparison signal; and a fourth MOS transistor having a gate, a drain and a source, wherein the gate receives the inverse first synch comparison signal and each drain/source are coupled to each of the ground and the fifth enable block.

18. The apparatus as recited in claim 17, wherein the fifth enable block includes a fifth MOS transistor having a gate, a drain and a source, wherein the gate receives the first comparison signal and each drain/source are coupled to each of the fourth and sixth enable blocks.

19. The apparatus as recited in claim 18, wherein the sixth enable block includes:
- a second NAND gate for receiving the first delay end signal and the locking selection signal to thereby generate a resultant signal of logic NAND operation;
- a fifth inverter for inverting the resultant signal outputted from the NAND gate; and
- a sixth MOS transistor having a gate, a drain and a source, wherein the gate receives the inverse resultant signal, which is outputted from the second inverter, and each drain/source is coupled to each of the second enable block and the output block.

* * * * *